United States Patent
Yoshimoto et al.

(10) Patent No.: US 10,770,659 B2
(45) Date of Patent: Sep. 8, 2020

(54) COMPOSITION FOR HOLE TRAPPING LAYER OF ORGANIC PHOTOELECTRIC CONVERSION ELEMENT

(71) Applicant: NISSAN CHEMICAL INDUSTRIES, LTD., Tokyo (JP)

(72) Inventors: Takuji Yoshimoto, Funabashi (JP); Juro Oshima, Funabashi (JP); Shun Sugawara, Funabashi (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 110 days.

(21) Appl. No.: 15/770,305

(22) PCT Filed: Oct. 21, 2016

(86) PCT No.: PCT/JP2016/081285
§ 371 (c)(1),
(2) Date: Apr. 23, 2018

(87) PCT Pub. No.: WO2017/077883
PCT Pub. Date: May 11, 2017

(65) Prior Publication Data
US 2018/0315927 A1    Nov. 1, 2018

(30) Foreign Application Priority Data

Nov. 6, 2015 (JP) ................. 2015-218584
Feb. 26, 2016 (JP) ................. 2016-035395

(51) Int. Cl.
| | |
|---|---|
| H01L 51/00 | (2006.01) |
| C08G 73/02 | (2006.01) |
| H01L 51/42 | (2006.01) |
| H01L 51/44 | (2006.01) |
| H01B 1/12 | (2006.01) |

(52) U.S. Cl.
CPC .......... *H01L 51/0037* (2013.01); *C08G 73/02* (2013.01); *C08G 73/0266* (2013.01); *H01L 51/424* (2013.01); *H01L 51/4273* (2013.01); *H01L 51/442* (2013.01); *H01B 1/124* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 6,611,096 B1 | 8/2003 | McCormick et al. | |
| 8,035,708 B2 | 10/2011 | Takizawa et al. | |
| 2005/0154119 A1 | 7/2005 | Robeson et al. | |
| 2009/0165861 A1* | 7/2009 | Yoshimoto | B82Y 10/00 136/263 |
| 2016/0315266 A1 | 10/2016 | Oshima et al. | |

FOREIGN PATENT DOCUMENTS

| | | |
|---|---|---|
| EP | 1 638 372 A1 | 3/2006 |
| EP | 2 700 676 A1 | 2/2012 |
| JP | 2003-509816 A | 3/2003 |
| JP | 2003-234460 A | 8/2003 |
| JP | 2005-248163 A | 9/2005 |
| JP | 2008-258474 A | 10/2008 |
| JP | 2011-138813 A | 7/2011 |

(Continued)

OTHER PUBLICATIONS

Shimizu et al, Synthetic Metals, 85 (1997) 1337-1338. (Year: 1997).*
International Search Report for PCT/JP2016/081285 (PCT/ISA/210) dated Jan. 24, 2017.
Li et al., "Polymer solar cells", Nature Photonics, vol. 6, published online Feb. 29, 2012, pp. 153-161.
Lim et al., "Organic-on-silicon complementary metal-oxide-semiconductor colour image sensors", Scientific Reports, 5 : 7703, Jan. 12, 2015, 7 pages.
O'Regan et al., "A low-cost, high-efficiency solar cell based on dye-sensitized colloidal TiO2 films", Nature, vol. 353, Oct. 24, 1991, pp. 737-740.

(Continued)

*Primary Examiner* — Eli S Mekhlin
(74) *Attorney, Agent, or Firm* — Birch, Stewart, Kolasch & Birch, LLP

(57) ABSTRACT

Provided is a composition for a hole trapping layer of an organic photoelectric conversion element, such composition: containing a solvent and a charge-transporting substance comprising a polyaniline derivative represented by formula (1); and providing a thin film that is suitable as a hole trapping layer of an organic photoelectric conversion element and can also be used to produce an inverse lamination type organic photoelectric conversion element.

(1)

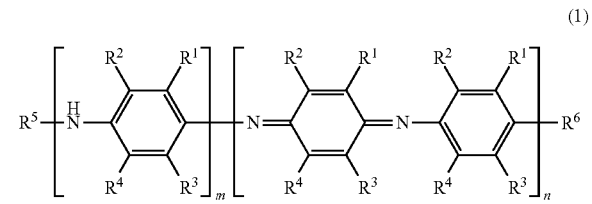

{$R^1$-$R^6$ each independently denote a hydrogen atom or the like, but one of the $R^1$-$R^4$ groups is a sulfonic acid group, one or more of the other $R^1$-$R^4$ groups is an alkoxy group having 1-20 carbon atoms, a thioalkoxy group having 1-20 carbon atoms, an alkyl group having 1-20 carbon atoms, an alkenyl group having 2-20 carbon atoms, an alkynyl group having 2-20 carbon atoms, a haloalkyl group having 1-20 carbon atoms, an aryl group having 6-20 carbon atoms or an aralkyl group having 7-20 carbon atoms, and m and n are numbers that satisfy the relationships $0 \leq m \leq 1$, $0 \leq n \leq 1$ and $m+n=1$.}

20 Claims, No Drawings

(56) References Cited

FOREIGN PATENT DOCUMENTS

| WO | WO 2014/119782 A1 | 8/2014 | | |
|----|-------------------|--------|---|---|
| WO | WO-2014119782 A1 * | 8/2014 | ........... | C07C 251/22 |
| WO | WO 2015/087797 A1 | 6/2015 | | |

OTHER PUBLICATIONS

Sai-Anand et al., "A futuristic strategy to influence the solar cell performance using fixed and mobile dopants incorporated sulfonated polyaniline based buffer layer", Solar Energy Materials and Solar Cells, vol. 141, 2015, pp. 275-290.

Tang, "Two-layer organic photovoltaic cell", Applied Physics Letters, vol. 48, No. 2, Jan. 13, 1986, pp. 183-185.

Written Opinion of the International Searching Authority for PCT/JP2016/081285 (PCT/ISA/237) dated Jan. 24, 2017.

Zhao et al., "Ultrathin Polyaniline-based Buffer Layer for Highly Efficient Polymer Solar Cells with Wide Applicability", Scientific Reports, 4 : 6570, Oct. 10, 2014, 7 pages.

Supplementary European Search Report dated Oct. 29, 2018 in European Patent Application No. 16861946.8.

* cited by examiner

COMPOSITION FOR HOLE TRAPPING LAYER OF ORGANIC PHOTOELECTRIC CONVERSION ELEMENT

TECHNICAL FIELD

The present invention relates to a composition for a hole-collecting layer in an organic photoelectric conversion device.

BACKGROUND ART

Organic solar cells are solar cell devices that use organic compounds in the active layer and the charge-transporting substances. The dye-sensitized solar cells developed by M. Grätzel and the organic thin-film solar cells developed by C. W. Tang are well known (Non-Patent Documents 1 and 2).

Because both have characteristics differing from those of the inorganic solar cells currently in mainstream use, including the fact that they are thin, lightweight films which can be made flexible, and the fact that roll-to-roll production is possible, they are expected to lead to the creation of new markets.

Of these, organic thin-film solar cells (also referred to below as organic photovoltaic cells or "OPVs") have attracted considerable attention in part because, in addition to having such characteristics as being electrolyte-free and heavy metal compound-free, they have recently been reported by a group at UCLA et al. as having a photoelectric conversion efficiency (abbreviated below as "PCE") of 10.6% (Non-Patent Document 3).

Also, given that organic thin-film solar cells, compared with existing photoelectric conversion devices that use silicon-based materials, have certain characteristics, such as exhibiting a high photoelectric conversion efficiency even under low illumination, enabling thinner devices and smaller pixels and the ability to provide also the attributes of a color filter, they are noteworthy not only in solar cell applications, but also in image sensor and other photosensor applications (Patent Documents 1 and 2, Non-Patent Document 4). Organic thin-film solar cells, including those for light sensors and other applications, are collectively referred to below as organic photoelectric conversion devices (sometimes abbreviated below as OPVs).

Organic photoelectric conversion devices are constructed of, for example, an active layer (photoelectric conversion layer), charge (hole, electron) collecting layers and electrodes (anode, cathode).

Of these, the active layer and the charge-collecting layers are generally formed by vacuum deposition processes. However, vacuum deposition has drawbacks in terms of, for example, its complexity as a mass production process, the high cost of the equipment, and the efficiency of material utilization.

In light of these drawbacks, water-dispersible polymeric organic conductive materials such as PEDOT/PSS are sometimes used as coating-type materials for forming hole-collecting layers. However, because these are aqueous dispersions, the complete removal of moisture and the control of moisture reabsorption are difficult, which tends to accelerate device deterioration.

Moreover, there remain a variety of challenges facing the use of aqueous dispersions of PEDOT/PSS in mass production. Namely, such dispersions are prone to solids agglomeration, and so defects readily arise in applied films made thereof and the coating equipment has a tendency to clog or corrode, in addition to which the applied films leave something to be desired in terms of heat resistance.

PRIOR ART DOCUMENTS

Non-Patent Documents

Patent Document 1: JP-A 2003-234460
Patent Document 2: JP-A 2008-258474
Non-Patent Document 1: *Nature*, Vol. 353, 737-740 (1991)
Non-Patent Document 2: *Appl. Phys. Lett.*, Vol. 48, 183-185 (1986)
Non-Patent Document 3: *Nature Photonics*, Vol. 6, 153-161 (2012)
Non-Patent Document 4: *Scientific Reports*, Vol. 5: 7708, 1-7 (2015)

SUMMARY OF INVENTION

Technical Problem

The present invention was arrived at in light of the above circumstances. An object of the invention is to provide a composition for a hole-collecting layer in an organic photoelectric conversion device, which composition provides a thin film suitable for the hole-collecting layer of an organic photoelectric conversion device and can also be applied to the production of inverted stack-type organic photoelectric conversion devices.

Solution to Problem

In the course of extensive investigations aimed at achieving the above object, the inventors have discovered the following. Polymers which include as recurring units anilinesulfonic acid having thereon specific electron-donating substituents such as alkoxy groups, and derivatives thereof, exhibit a high hole transportability, have a low corrosiveness with respect to the active layer, and exhibit a high solubility in polar protic solvents such as alcohol or water to form a uniform solution. When the solution is formed into a thin film by a coating operation and thereby rendered into the hole-collecting layer of an OPV device, it is possible to obtain in a high yield OPV devices that exhibit a good photoelectric conversion efficiency. Also, during preparation of this solution, by adding an electron-accepting dopant substance composed primarily of a highly oxidizing Brønsted acid, the HOMO level of the resulting thin film can be controlled, enabling the efficient collection and transport of holes, as a result of which an OPV device which exhibits a higher photoelectric conversion efficiency and manifests a high durability can be obtained. The inventors have also found that, by adding a suitable type and amount of alkoxysilane material to the solution, electron-blocking properties can be imparted to the resulting thin film and, at the same time, strong solvent resistance and water resistance can be imparted.

Accordingly, the invention provides:

1. A composition for a hole-collecting layer in an organic photoelectric conversion device, the composition comprising a charge-transporting substance consisting of a polyaniline derivative of formula (1)

[Chem. 1]

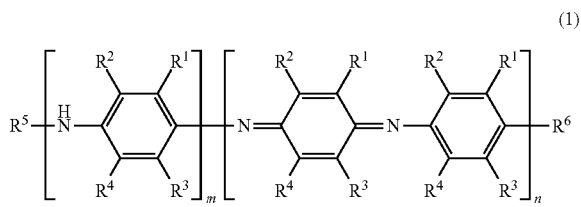
(1)

(wherein $R^1$ to $R^6$ are each independently a hydrogen atom, a halogen atom, a nitro group, a cyano group, a sulfonic acid group, an alkoxy group of 1 to 20 carbon atoms, a thioalkoxy group of 1 to 20 carbon atoms, an alkyl group of 1 to 20 carbon atoms, an alkenyl group of 2 to 20 carbon atoms, an alkynyl group of 2 to 20 carbon atoms, a haloalkyl group of 1 to 20 carbon atoms, an aryl group of 6 to 20 carbon atoms, an aralkyl group of 7 to 20 carbon atoms or an acyl group of 1 to 20 carbon atoms, with one of the $R^1$ to $R^4$ moieties being a sulfonic acid group and at least one of the remaining $R^1$ to $R^4$ moieties being an alkoxy group of 1 to 20 carbon atoms, a thioalkoxy group of 1 to 20 carbon atoms, an alkyl group of 1 to 20 carbon atoms, an alkenyl group of 2 to 20 carbon atoms, an alkynyl group of 2 to 20 carbon atoms, a haloalkyl group of 1 to 20 carbon atoms, an aryl group of 6 to 20 carbon atoms or an aralkyl group of 7 to 20 carbon atoms; and m and n are each numbers which satisfy the conditions $0 \le m \le 1$, $0 \le n \le 1$ and $m+n=1$), and a solvent;

2. The composition for a hole-collecting layer in an organic photoelectric conversion device according to 1 above, wherein $R^1$ is a sulfonic acid group and $R^4$ is an alkoxy group of 1 to 20 carbon atoms;

3. The composition for a hole-collecting layer in an organic photoelectric conversion device according to 1 or 2 above, further comprising an electron-accepting dopant substance that differs from the polyaniline derivative of formula (1);

4. The composition for a hole-collecting layer in an organic photoelectric conversion device according to 3 above, wherein the electron-accepting dopant substance is a Brønsted acid;

5. The composition for a hole-collecting layer in an organic photoelectric conversion device according to 3 or 4 above, wherein the electron-accepting dopant substance is an arylsulfonic acid compound of formula (2)

[Chem. 2]

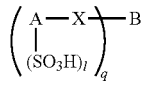
(2)

(wherein X represents oxygen; A is a naphthalene ring or an anthracene ring; B is a divalent to tetravalent perfluorobiphenyl group; the letter l is an integer that represents the number of sulfonic acid groups bonded to A and satisfies the condition $1 \le l \le 4$; and q is an integer that represents the number of bonds between B and X and is from 2 to 4), naphthalenetrisulfonic acid or polystyrenesulfonic acid;

6. The composition for a hole-collecting layer in an organic photoelectric conversion device according to any of 1 to 5 above, further comprising an alkoxysilane;

7. The composition for a hole-collecting layer in an organic photoelectric conversion device according to any of 1 to 6 above, wherein the organic photoelectric conversion device is an organic thin-film solar cell or a photosensor;

8. The composition for a hole-collecting layer in an organic photoelectric conversion device according to any of 1 to 7 above, wherein the solvent includes a high-viscosity solvent having a viscosity at 25° C. of from 10 to 500 mPa·s;

9. The composition for a hole-collecting layer in an organic photoelectric conversion device according to any of 1 to 8 above, wherein the solvent consists of one or more solvent selected from alcohol solvents and water;

10. A hole-collecting layer obtained using the composition for a hole-collecting layer in an organic photoelectric conversion device according to any of 1 to 9 above;

11. An organic photoelectric conversion device comprising the hole-collecting layer of 10 above and an active layer provided so as to be in contact therewith;

12. The organic photoelectric conversion device of 11 above, wherein the ionizing potential of the hole-collecting layer and the ionizing potential of a p-type semiconductor included in the active layer have a difference therebetween of not more than 0.2 eV;

13. The organic photoelectric conversion device of 11 or 12 above, wherein the active layer includes a fullerene derivative;

14. The organic photoelectric conversion device of 11 or 12 above, wherein the active layer includes a polymer having a thiophene skeleton on the main chain;

15. The organic photoelectric conversion device of 11 or 12 above, wherein the active layer includes a fullerene derivative and a polymer having a thiophene skeleton on the main chain;

16. The organic photoelectric conversion device of any of 11 to 15 above which is an inverted stack structure-type device;

17. The organic photoelectric conversion device of any of 11 to 16 above which is an organic thin-film solar cell or a photosensor;

18. A charge-transporting composition comprising a charge-transporting substance consisting of a polyaniline derivative of formula (1)

[Chem. 3]

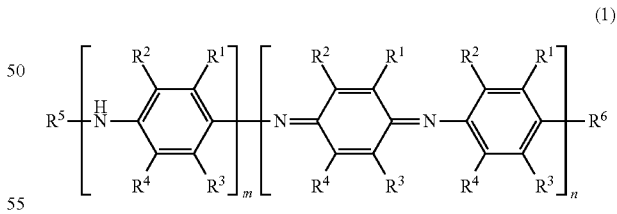
(1)

(wherein $R^1$ to $R^6$ are each independently a hydrogen atom, a halogen atom, a nitro group, a cyano group, a sulfonic acid group, an alkoxy group of 1 to 20 carbon atoms, a thioalkoxy group of 1 to 20 carbon atoms, an alkyl group of 1 to 20 carbon atoms, an alkenyl group of 2 to 20 carbon atoms, an alkynyl group of 2 to 20 carbon atoms, a haloalkyl group of 1 to 20 carbon atoms, an aryl group of 6 to 20 carbon atoms, an aralkyl group of 7 to 20 carbon atoms or an acyl group of 1 to 20 carbon atoms, with one of the $R^1$ to $R^4$ moieties being a sulfonic acid group and at least one of the remaining $R^1$ to $R^4$ moieties being an alkoxy group of 1 to 20 carbon atoms, a thioalkoxy group of 1 to 20 carbon atoms, an alkyl group of 1 to 20 carbon atoms, an alkenyl group of 2 to 20 carbon atoms, an alkynyl group of 2 to 20 carbon atoms, a haloalkyl group of 1 to 20 carbon atoms, an aryl group of 6 to 20 carbon atoms or an aralkyl group of 7 to 20 carbon atoms; and m and n are each numbers which satisfy the conditions $0 \leq m \leq 1$, $0 \leq n \leq 1$ and $m+n=1$), an electron-accepting dopant substance differing from the polyaniline derivative of formula (1), and a solvent;

19. The charge-transporting composition of 18 above which further comprises an alkoxysilane; and
20. The charge-transporting composition of 18 or 19 above, wherein the electron-accepting dopant substance is an arylsulfonic acid compound of formula (2)

[Chem. 4]

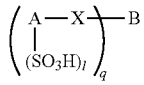
(2)

(wherein X represents oxygen, A is a naphthalene ring or an anthracene ring, B is a divalent to tetravalent perfluorobiphenyl group, the letter l is an integer that represents the number of sulfonic acid groups bonded to A and satisfies the condition $1 \leq l \leq 4$, and q is an integer that represents the number of bonds between B and X and is from 2 to 4), naphthalenetrisulfonic acid or polystyrenesulfonic acid.

Advantageous Effects of Invention

The inventive composition for a hole-collecting layer in an organic photoelectric conversion device can be prepared using a charge-transporting substance consisting of a polyaniline derivative that is commercially available at low cost or can be easily synthesized by a known method. Also, by using a thin film obtained therefrom as a hole-collecting layer, an organic thin-film solar cell having an excellent photoelectric conversion efficiency can be obtained. Moreover, because it is possible to form a highly uniform thin film using the hole-collecting layer composition of the invention, by employing this highly uniform thin film as a hole-collecting layer, current leakage can be suppressed and the reverse bias dark current can be minimized. Therefore, it is possible to employ a thin film made of the inventive hole-collecting layer composition in device structures similar to organic thin-film solar cells and to carry out detection by converting a very small amount of photons to electrons, and so it is also possible to employ a hole-collecting layer obtained from this composition in photosensor applications such as high-performance image sensor applications.

Also, because the charge-transporting substance consisting of the polyaniline derivative used in this invention has an excellent solubility in polar protic solvents such as alcohol and water, enabling the composition to be prepared using such solvents which tend not to adversely affect the active layer, it is also suitable for the production of inverted stack-type organic thin-film solar cells in which a hole-collecting layer is formed on an active layer.

Furthermore, by adding an electron-accepting dopant substance consisting of a Brønsted acid, an OPV device which exhibits a higher photoelectric conversion efficiency and has a high durability can be obtained.

DESCRIPTION OF EMBODIMENTS

The invention is described below in greater detail.
The composition for a hole-collecting layer in an organic photoelectric conversion device includes a charge-transporting substance consisting of a polyaniline derivative of formula (1) below, and a solvent.

[Chem. 5]

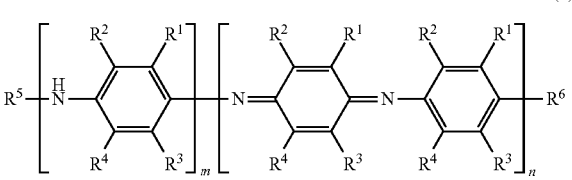
(1)

In formula (1), $R^1$ to $R^6$ are each independently a hydrogen atom, a halogen atom, a nitro group, a cyano group, a sulfonic acid group, an alkoxy group of 1 to 20 carbon atoms, a thioalkoxy group of 1 to 20 carbon atoms, an alkyl group of 1 to 20 carbon atoms, an alkenyl group of 2 to 20 carbon atoms, an alkynyl group of 2 to 20 carbon atoms, a haloalkyl group of 1 to 20 carbon atoms, an aryl group of 6 to 20 carbon atoms, an aralkyl group of 7 to 20 carbon atoms or an acyl group of 1 to 20 carbon atoms, with one of the $R^1$ to $R^4$ moieties being a sulfonic acid group and at least one of the remaining $R^1$ to $R^4$ moieties being an alkoxy group of 1 to 20 carbon atoms, a thioalkoxy group of 1 to 20 carbon atoms, an alkyl group of 1 to 20 carbon atoms, an alkenyl group of 2 to 20 carbon atoms, an alkynyl group of 2 to 20 carbon atoms, a haloalkyl group of 1 to 20 carbon atoms, an aryl group of 6 to 20 carbon atoms or an aralkyl group of 7 to 20 carbon atoms.

Exemplary halogen atoms include fluorine, chlorine, bromine and iodine atoms.

Exemplary alkyl groups of 1 to 20 carbon atoms include acyclic alkyl groups of 1 to 20 carbon atoms, such as methyl, ethyl, n-propyl, isopropyl, n-butyl, isobutyl, s-butyl, t-butyl, n-pentyl, n-hexyl, n-heptyl, n-octyl, n-nonyl and n-decyl groups; and cyclic alkyl groups of 3 to 20 carbon atoms, such as cyclopropyl, cyclobutyl, cyclopentyl, cyclohexyl, cycloheptyl, cyclooctyl, cyclononyl, cyclodecyl, bicyclobutyl, bicyclopentyl, bicyclohexyl, bicycloheptyl, bicyclooctyl, bicyclononyl and bicyclodecyl groups.

Exemplary alkenyl groups of 2 to 20 carbon atoms include ethenyl, n-1-propenyl, n-2-propenyl, 1-methylethenyl, n-1-butenyl, n-2-butenyl, n-3-butenyl, 2-methyl-1-propenyl, 2-methyl-2-propenyl, 1-ethylethenyl, 1-methyl-1-propenyl, 1-methyl-2-propenyl, n-1-pentenyl, n-1-decenyl and n-1-eicosenyl groups.

Exemplary alkynyl groups of 2 to 20 carbon atoms include ethynyl, n-1-propynyl, n-2-propynyl, n-1-butynyl, n-2-butynyl, n-3-butynyl, 1-methyl-2-propynyl, n-1-pentynyl, n-2-pentynyl, n-3-pentynyl, n-4-pentynyl, 1-methyl-n-butynyl, 2-methyl-n-butynyl, 3-methyl-n-butynyl, 1,1-dimethyl-n-propynyl, n-1-hexynyl, n-1-decynyl, n-1-pentadecynyl and n-1-eicosynyl groups.

Exemplary alkoxy groups of 1 to 20 carbon atoms include methoxy, ethoxy, n-propoxy, i-propoxy, c-propoxy, n-butoxy, i-butoxy, s-butoxy, t-butoxy, n-pentoxy, n-hexoxy, n-heptyloxy, n-octyloxy, n-nonyloxy, n-decyloxy, n-undecyloxy, n-dodecyloxy, n-tridecyloxy, n-tetradecyloxyo-pentadecyloxy, n-hexadecyloxy, n-heptadecyloxy, n-octadecyloxy, n-nonadecyloxy and n-eicosanyloxy groups.

Exemplary thioalkoxy groups of 1 to 20 carbon atoms include the above alkoxy groups in which the oxygen atom is substituted with a sulfur atom.

Exemplary thioalkoxy (alkylthio) groups of 1 to 20 carbon atoms include methylthio, ethylthio, n-propylthio, isopropylthio, n-butylthio, isobutylthio, s-butylthio, t-butylthio, n-pentylthio, n-hexylthio, n-heptylthio, n-octylthio, n-nonylthio, n-decylthio, n-undecylthio, n-dodecylthio, n-tridecylthio, n-tetradecylthio, n-pentadecylthio, n-hexadecylthio, n-heptadecylthio, n-octadecylthio, n-nonadecylthio and n-eicosanylthio groups.

Exemplary haloalkyl groups of 1 to 20 carbon atoms include the above alkyl groups in which at least one hydrogen atom is substituted with a halogen atom. The halogen atom may be any from among chlorine, bromine, iodine and fluorine atoms. Of these, a fluoroalkyl group is preferred, and a perfluoroalkyl group is more preferred.

Illustrative examples include fluoromethyl, difluoromethyl, trifluoromethyl, pentafluoroethyl, 2,2,2-trifluoroethyl, heptafluoropropyl, 2,2,3,3,3-pentafluoropropyl, 2,2,3,3-tetrafluoropropyl, 2,2,2-trifluoro-1-(trifluoromethyl)ethyl, nonafluorobutyl, 4,4,4-trifluorobutyl, undecafluoropentyl, 2,2,3,3,4,4,5,5,5-nonafluoropentyl, 2,2,3,3,4,4,5,5-octafluoropentyl, tridecafluorohexyl, 2,2,3,3,4,4,5,5,6,6,6-undecafluorohexyl, 2,2,3,3,4,4,5,5,6,6-decafluorohexyl and 3,3,4,4,5,5,6,6,6-nonafluorohexyl groups.

Exemplary aryl groups of 6 to 20 carbon atoms include phenyl, 1-naphthyl, 2-naphthyl, 1-anthryl, 2-anthryl, 9-anthryl, 1-phenanthryl, 2-phenanthryl, 3-phenanthryl, 4-phenanthryl and 9-phenanthryl groups.

Exemplary aralkyl groups of 7 to 20 carbon atoms include benzyl, p-methylphenylmethyl, m-methylphenylmethyl, o-ethylphenylmethyl, m-ethylphenylmethyl, p-ethylphenylmethyl, 2-propylphenylmethyl, 4-isopropylphenylmethyl, 4-isobutylphenylmethyl and α-naphthylmethyl groups.

Exemplary acyl groups of 1 to 20 carbon atoms include formyl, acetyl, propionyl, butyryl, isobutyryl, valeryl, isovaleryl and benzoyl groups.

As noted above, in the polyaniline derivative of formula (1) used in the invention, one of the $R^1$ to $R^4$ moieties is a sulfonic acid group and at least one of the remaining $R^1$ to $R^4$ moieties, preferably a single one of the remaining $R^1$ to $R^4$ moieties, is an electron-donating group that is an alkoxy group of 1 to 20 carbon atoms, a thioalkoxy group of 1 to 20 carbon atoms, an alkyl group of 1 to 20 carbon atoms, an alkenyl group of 2 to 20 carbon atoms, an alkynyl group of 2 to 20 carbon atoms, a haloalkyl group of 1 to 20 carbon atoms, an aryl group of 6 to 20 carbon atoms or an aralkyl group of 7 to 20 carbon atoms. In particular, an alkoxy group of 1 to 20 carbon atoms, a thioalkoxy group of 1 to 20 carbon atoms or an alkyl group of 1 to 20 carbon atoms is preferred, an alkoxy group of 1 to 20 carbon atoms is more preferred, and an alkoxy group of 1 to 10 carbon atoms is even more preferred.

The place of substitution is not particularly limited. However, in this invention, it is preferable for $R^1$ to be a sulfonic acid group and it is preferable for $R^4$ to be an alkoxy group of 1 to 20 carbon atoms.

In addition, $R^2$, $R^3$, $R^5$ and $R^6$ are preferably all hydrogen atoms.

In formula (1), the subscripts m and n are respectively numbers which satisfy the conditions $0 \leq m \leq 1$, $0 \leq n \leq 1$ and $m+n=1$. To further increase the conductivity of the resulting hole-collecting layer, it is preferable for $0 < n < 1$, and more preferable for $0.1 \leq n \leq 0.9$.

The molecular weight of the polyaniline derivative of formula (1) is not particularly limited. However, taking into consideration the electrical conductivity, the lower limit is generally at least 200 and preferably at least 1,000. In terms of improved solubility in the solvent, the upper limit is generally not more than 5,000,000, and preferably not more than 500,000.

In the inventive composition, the polyaniline derivative of formula (1) may be used singly or two or more compounds may be used in combination.

The polyaniline derivative of formula (1) that is used may be a commercial product or may be one that is polymerized by a known method using an aniline derivative or the like as the starting material. In either case, it is preferable to use one that has been purified by a method such as re-precipitation or ion exchange. By using one that has been purified, the characteristics of the OPV device having a thin film obtained from the composition containing this compound can be further increased.

In an organic thin-film solar cell, the ionization potential of the hole-collecting layer is preferably a value that is close to the ionization potential of the p-type semiconductor material in the active layer. The absolute value of the difference therebetween is preferably from 0 to 1 eV, more preferably from 0 to 0.5 eV, and even more preferably from 0 to 0.2 eV.

Accordingly, an electron-accepting dopant substance may be included in the hole-collecting layer composition of the invention for the purpose of adjusting the ionization potential of the charge-transporting thin film obtained using the composition.

The electron-accepting dopant substance is not particularly limited, provided it is one that dissolves in at least one of the solvents used.

Specific examples of electron-accepting dopant substances include strong inorganic acids such as hydrogen chloride, sulfuric acid, nitric acid and phosphoric acid; Lewis acids such as aluminum(III) chloride ($AlCl_3$), titanium(IV) tetrachloride ($TiCl_4$), boron tribromide ($BBr_3$), a boron trifluoride-ether complex ($BF_3 \cdot OEt_2$), iron(III) chloride ($FeCl_3$), copper(II) chloride ($CuCl_2$), antimony(V) pentachloride ($SbCl_5$), arsenic(V) pentafluoride ($AsF_5$), phosphorus pentafluoride ($PF_5$) and tris(4-bromophenyl) aluminum hexachloroantimonate (TBPAH); strong organic acids such as benzenesulfonic acid, tosylic acid, camphorsulfonic acid, hydroxybenzenesulfonic acid, 5-sulfosalicylic acid, dodecylbenzenesulfonic acid, naphthalenedisulfonic acids (e.g., 1,5-naphthalenedisulfonic acid), naphthalenetrisulfonic acids (e.g., 1,3,5-naphthalenetrisulfonic acid, 1,3,6-naphthalenetrisulfonic acid), polystyrenesulfonic acid, the 1,4-benzodioxanedisulfonic acid compounds mentioned in WO 2005/000832, the arylsulfonic acid compounds mentioned in WO 2006/025342, the dinonylnaphthalenesulfonic acid mentioned in JP-A 2005-108828, and 1,3,6-naphthalenetrisulfonic acid; organic oxidizing agents such as 7,7,8,8-tetracyanoquinodimethane (TCNQ), 2,3-dichloro-5,6-dicyano-1,4-benzoquinone (DDQ), and iodine; and inorganic oxidizing agents such as heteropolyacids (e.g., the phosphomolybdic acid, phosphotungstic acid and phosphotungstomolybdic acid mentioned in WO 2010/058777). These may be used singly, or two or more may be used in combination.

Of these various types of electron-accepting dopant substances, in this invention, Brønsted acids that donate $H^+$ are preferred, arylsulfonic acid compounds are more preferred, and arylsulfonic acid compounds of formula (2), naphthalenesulfonic acids such as 1,3,5-naphthalenetrisulfonic acid and 1,3,6-naphthalenetrisulfonic acid, and polystyrenesulfonic acid are especially preferred. Arylsulfonic acid compounds of formula (2) are most preferred.

[Chem. 6]

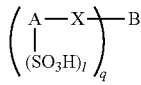
(2)

In formula (2), X represents oxygen, A is a naphthalene ring or an anthracene ring, B is a divalent to tetravalent perfluorobiphenyl group, the letter l is an integer that represents the number of sulfonic acid groups bonded to A and satisfies the condition 1≤l≤4, and q is an integer that represents the number of bonds between B and Z and is from 2 to 4.

In this invention, an example of an arylsulfonic acid compound that can be preferably used is the following compound (formula (2-1)).

[Chem. 7]

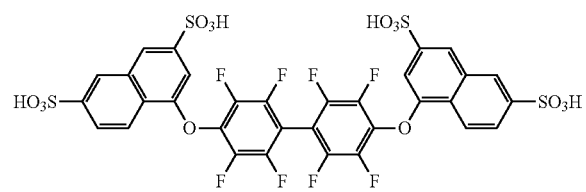
(2-1)

In addition, other additives may be included in the inventive composition, so long as the objects of the invention can be attained.

The types of additives used may be suitably selected from among known additives according to the desired effects. From the standpoint of improving the solvent resistance and water resistance of the resulting thin film, enhancing the electron blocking properties, and having the HOMO level and LUMO level be the optimal values for the active layer, adding an alkoxysilane or a siloxane material is preferred.

Any one or more alkoxysilane from among tetraalkoxysilanes, trialkoxysilanes and dialkoxysilanes may be used as the alkoxysilane. Tetraethoxysilane, tetramethoxysilane, phenyltriethoxysilane, phenyltrimethoxysilane, methyltriethoxysilane, methyltrimethoxysilane, 3,3,3-trifluoropropyltrimethoxysilane, dimethyldiethoxysilane and dimethyldimethoxysilane are preferred; tetraethoxysilane is more preferred.

Examples of siloxane materials include polysiloxanes such as poly(tetraethoxysilane) and poly(phenylethoxysilane) that can be obtained by a reaction such as hydrolysis of the above alkoxysilane.

The amount of alkoxysilane or siloxane material added is not particularly limited so long as it is an amount that manifests the above effects. Expressed as a weight ratio relative to the polyaniline derivative used in the invention, the amount of addition is preferably from 0.0001 to 100-fold, more preferably from 0.01 to 50-fold, and even more preferably from 0.05 to 10-fold.

The solvent used to prepare the hole-collecting layer composition may be a high-solvency solvent that can dissolve well the polyaniline derivative and the electron-accepting dopant substance. A single high-solvency solvent may be used alone or two or more may be used in admixture. The amount of solvent used, relative to the overall solvent used in the composition, may be set to from 5 to 100 wt %.

Illustrative examples of such high-solvency solvents include water; and organic solvents such as alcohol solvents (e.g., ethanol, 2-propanol, 1-butanol, 2-butanol, s-butanol, t-butanol, 1-methoxy-2-propanol) and amide solvents (e.g., N-methylformamide, N,N-dimethylformamide, N,N-diethylformamide, N-methylacetamide, N,N-dimethylacetamide, N-methylpyrrolidone and 1,3-dimethyl-2-imidazolidinone).

Of these, at least one selected from water and alcohol solvents is preferred, and water, ethanol and 2-propanol are more preferred.

In particular, in cases where the inventive composition is to be used to form a hole-collecting layer in an inverted stack-type OPV device, the use of a solvent which does not exert an adverse influence on the active layer and consists solely of one or more solvent selected from among alcohol solvents and water is preferred.

It is preferable for both the charge-transporting substance and the electron-accepting dopant substance to be in a completely dissolved or uniformly dispersed state within the above solvent. From the standpoint of reproducibly obtaining a hole-collecting layer that provides an organic thin-film solar cell having a high conversion efficiency, it is more preferable for these substances to be completely dissolved in the above solvent.

To enhance film formability and dischargeability from the coating equipment, the hole-collecting layer composition of the invention may include at least one high-viscosity organic solvent having a viscosity at 25° C. of from 10 to 200 mPa·s, preferably from 35 to 150 mPa·s, and a boiling point at standard pressure of from 50 to 300° C., preferably from 150 to 250° C.

Examples of the high-viscosity organic solvent include, without particular limitation, cyclohexanol, ethylene glycol, 1,3-octylene glycol, diethylene glycol, dipropylene glycol, triethylene glycol, tripropylene glycol, 1,3-butanediol, 2,3-butanediol, 1,4-butanediol, propylene glycol and hexylene glycol.

The addition ratio of high-viscosity organic solvent with respect to the overall solvent used in the inventive composition is preferably in a range within which the deposition of solids does not occur. An addition ratio of from 5 to 80 wt % is preferred, so long as solids do not deposit out.

In addition, another solvent capable of imparting flatness to the film during heat treatment may also be admixed in a ratio with respect to the overall solvent used in the composition of from 1 to 90 wt %, preferably from 1 to 50 wt %, for such purposes as to increase the ability of the composition to wet the surface to which it is applied and to adjust the solvent surface tension, polarity, and boiling point.

Examples of such solvents include, but are not limited to, butyl cellosolve, diethylene glycol diethyl ether, diethylene glycol dimethyl ether, diethylene glycol monoethyl ether acetate, diethylene glycol monobutyl ether acetate, dipropylene glycol monomethyl ether, propylene glycol monomethyl ether, propylene glycol monomethyl ether acetate, ethyl carbitol, diacetone alcohol, γ-butyrolactone, ethyl lactate and n-hexyl acetate.

The solids concentration of the inventive composition, which is suitably set while taking into account the viscosity, surface tension and other properties of the composition and the thickness and other properties of the thin film to be produced, is generally from about 0.1 to about 10.0 wt %, preferably from 0.5 to 5.0 wt %, and more preferably from 1.0 to 3.0 wt %.

The weight ratio between the charge-transporting substance and the electron-accepting dopant substance, which is suitably set while taking into account such factors as the charge transportability to be achieved and the type of charge transporting substance, is generally from 0 to 10, preferably from 0.1 to 3.0, and more preferably from 0.2 to 2.0, of the electron-accepting dopant substance relative to unity (1) for the charge-transporting substance.

The viscosity of the hole-collecting layer composition used in the invention, which is suitably adjusted according to the coating method while taking into account the thickness and other properties of the thin film to be formed and the solids concentration, is generally from about 0.1 mPa·s to about 50 mPa·s at 25° C.

When preparing the inventive composition, the charge-transporting substance, electron-accepting dopant substance and solvent can be mixed together in any order, provided that the solids uniformly dissolve or disperse in the solvent. That is, so long as the solids uniformly dissolve or disperse in the solvent, any of the following methods may be used: the method of dissolving the polyaniline derivative in the solvent, and then dissolving the electron-accepting dopant substance in the resulting solution; the method of dissolving the electron-accepting dopant substance in the solvent, and then dissolving the polyaniline derivative substance in the resulting solution; and the method of mixing together the polyaniline derivative and the electron-accepting dopant substance, and then poring the mixture into and dissolving it within the solvent.

Preparation of the composition is generally carried out in an inert gas atmosphere at standard temperature and pressure, although it may be carried out in an open-air atmosphere (in the presence of oxygen) or may be carried out under heating, provided that the compounds within the composition do not decompose and the composition does not undergo any large change in makeup.

The hole-collecting layer of the invention can be formed by coating the above-described composition onto the anode in the case of a normal stack-type organic thin-film solar cell, and onto the active layer in the case of an inverted stack-type organic thin-film solar cell, and then baking the composition.

In coating, the optimal technique from among various types of wet processes such as drop casting, spin coating, blade coating, dip coating, roll coating, bar coating, die coating, inkjet coating and printing methods (e.g., relief printing, intaglio printing, lithography, screen printing) may be used while taking into account, for example, the viscosity and surface tension of the composition and the desired thickness of the thin film.

Coating is generally carried out in an inert gas atmosphere at standard temperature and pressure, although it may be carried out in an open-air atmosphere (in the presence of oxygen) or may be carried out under heating, provided that the compounds within the composition do not decompose and the composition does not undergo any large change in makeup.

The film thickness, although not particularly limited, is in all cases preferably from about 0.1 mm to about 500 nm, and more preferably from about 1 mm to about 100 nm. Methods for changing the film thickness include methods that involve changing the solids concentration in the composition and methods that involve changing the amount of solution applied during coating.

Methods for producing organic thin-film solar cells using the hole-collecting layer-forming composition of the invention are described below, although the invention is not limited thereby.

(1) Normal Stack-Type Organic Thin-Film Solar Cell
[Formation of Anode Layer]:
Step of Producing a Transparent Electrode by Forming a Layer of Anode Material on Surface of a Transparent Substrate An inorganic oxide such as indium-tin oxide (ITO) or indium-zinc oxide (IZO), a metal such as gold, silver or aluminum, or an organic compound having high charge transportability, such as a polythiophene derivative or a polyaniline derivative may be used as the anode material. Of these, ITO is most preferred. A substrate made of glass or a clear resin may be used as the transparent substrate.

The method of forming the layer of anode material (anode layer) is suitably selected according to the nature of the anode material. Generally, in the case of a material that is difficult to dissolve, difficult to disperse and sublimable, a dry process such as vapor deposition or sputtering is selected. In the case of a solution material or a dispersion material, taking into account, for example, the viscosity and surface tension of the composition and the desired thickness of the thin film, the optimal method from among the various above-mentioned types of wet processes is employed.

Alternatively, a commercial transparent anode substrate may be used. In this case, from the standpoint of increasing the device yield, the use of a substrate that has been subjected to leveling treatment is preferred. When a commercial transparent anode substrate is used, the method of manufacturing the organic thin-film solar cell of the invention does not include an anode layer-forming step.

In cases where a transparent anode substrate is formed using an inorganic oxide such as ITO as the anode material, before depositing the top layer thereon, it is preferable to clean the substrate with, for example, a cleaning agent, alcohol or pure water. In addition, the anode substrate is preferably subjected to surface treatment such as UV/ozone treatment or oxygen-plasma treatment just prior to use. Surface treatment need not be carried out if the anode material is composed primarily of an organic substance.

[Formation of Hole-Collecting Layer]:
Step of Forming a Hole-Collecting Layer on the Formed Layer of Anode Material Using the inventive composition, a hole-collecting layer is formed on the anode material layer in accordance with the above-described method.

[Formation of Active Layer]:
Step of Forming an Active Layer on the Formed Hole-Collecting Layer The active layer may be a layer obtained by stacking an n layer which is a thin film consisting of an n-type semiconductor material and a p layer which is a thin film consisting of a p-type semiconductor material, or may be a non-stacked thin film consisting of a mixture of these materials.

Illustrative examples of n-type semiconductor materials include fullerene, [6,6]-phenyl-$C_{61}$-butyric acid methyl ester ($PC_{61}BM$) and [6,6]-phenyl-$C_{71}$-butyric acid methyl ester ($PC_{71}BM$). Illustrative examples of p-type semiconductor materials include regioregular-poly(3-hexylthiophene) (P3HT), PTB7 of formula (4) below, polymers having a thiophene skeleton on the main chain, including thienothiophene unit-containing polymers such as those mentioned in JP-A 2009-158921 and WO 2010/008672, phthalocyanines such as CuPC and ZnPC, and porphyrins such as tetrabenzoporphyrin.

[Chem. 8]

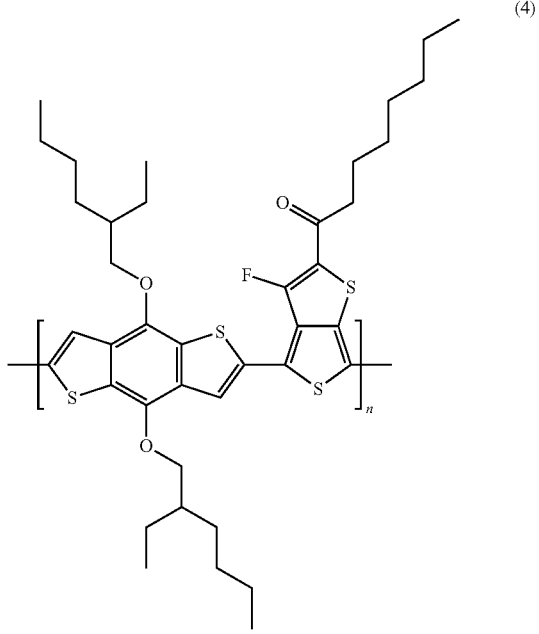

(4)

Of these, $PC_{61}BM$ and $PC_{71}BM$ are preferred as the n-type material, and polymers having a thiophene skeleton on the main chain, such as PTB7, are preferred as the p-type material.

As used herein, "thiophene skeleton on the main chain" refers to divalent aromatic rings consisting entirely of thiophene, or divalent condensed aromatic rings containing one or more thiophene, such as thienothiophene, benzothiophene, dibenzothiophene, benzodithiophene, naphthothiophene, naphthodithiophene, anthrathiophene and anthradithiophene. These may be substituted with the substituents represented by $R^1$ to $R^6$ above.

The method of forming the active layer too, as described above, is selected from among the various above-mentioned dry processes in cases where the active layer material is a material that is difficult to dissolve and sublimable. In the case of a solution material or a dispersion material, taking into account, for example, the viscosity and surface tension of the composition and the desired thickness of the thin film, the optimal method from among the various types of wet processes mentioned above is employed.

[Formation of Electron-Collecting Layer]:

Step of Forming an Electron-Collecting Layer on the Formed Active Layer

Where necessary, an electron-collecting layer may be formed between the active layer and the cathode layer in order to, for example, make charge transport more efficient.

Illustrative examples of electron-collecting layer-forming materials include lithium oxide ($Li_2O$), magnesium oxide (MgO), alumina ($Al_2O_3$), lithium fluoride (LiF), sodium fluoride (NaF), magnesium fluoride ($MgF_2$), strontium fluoride ($SrF_2$), cesium carbonate ($Cs_2CO_3$), lithium 8-quinolinolate (Liq), sodium 8-quinolinolate (Naq), bathocuproin (BCP), 4,7-diphenyl-1,10-phenanthroline (BPhen), polyethyleneimine (PEI) and ethoxylated polyethyleneimine (PEIE).

The method of forming the electron-collecting layer too, as described above, is selected from among the various above-mentioned dry processes in cases where the electron-collecting material is a material that is difficult to dissolve and sublimable. In the case of a solution material or a dispersion material, taking into account, for example, the viscosity and surface tension of the composition and the desired thickness of the thin film, the optimal method from among the various types of wet processes mentioned above is employed.

[Formation of Cathode Layer]:

Step of Forming a Cathode Layer on the Formed Electron-Collecting Layer

Illustrative examples of cathode materials include metals such as aluminum, magnesium-silver alloys, aluminum-lithium alloys, lithium, sodium, potassium, cesium, calcium, barium, silver and gold; inorganic oxides such as indium tin oxide (ITO) and indium zinc oxide (IZO); and organic compounds having high charge transportability, such as polythiophene derivatives and polyaniline derivatives. A plurality of cathode materials may be used by stacking as a plurality of layers or by mixture together.

The method of forming the cathode layer too, as described above, is selected from among the various above-mentioned dry processes in cases where the cathode layer material is a material that is difficult to dissolve, difficult to disperse and sublimable. In the case of a solution material or a dispersion material, taking into account, for example, the viscosity and surface tension of the composition and the desired thickness of the thin film, the optimal method from among the various types of wet processes mentioned above is employed.

[Formation of Carrier-Blocking Layers]

Where necessary, carrier-blocking layers may be provided to desired layer intervals for such purposes as to control the rectifiability of the photoelectric current. In cases where carrier-blocking layers are provided, it is customary to insert an electron-blocking layer between the active layer and the hole-collecting layer or the anode, and to insert a hole-blocking layer between the active layer and the electron-collecting layer or the cathode, although the invention is not limited in this regard.

Examples of hole-blocking layer-forming materials include titanium oxide, zinc oxide, tin oxide, bathocuproin (BCP) and 4,7-diphenyl-1,10-phenanthroline (BPhen).

Examples of electron-blocking layer-forming materials include triarylamine materials such as N,N'-di(1-naphthyl)-N,N'-diphenylbenzidine (α-NPD) and poly(triarylamine) (PTAA).

The method of forming the carrier-blocking layers too, as described above, is selected from among the various above-mentioned dry processes in cases where the carrier-blocking layer material is a material that is difficult to dissolve, difficult to disperse and sublimable. In the case of a solution material or a dispersion material, taking into account, for example, the viscosity and surface tension of the composition and the desired thickness of the thin film, the optimal method from among the various types of wet processes mentioned above is employed.

(2) Inverted Stack-Type Organic Thin-Film Solar Cell

[Formation of Cathode Layer]:

Step of Producing a Transparent Cathode Substrate by Forming a Layer of Cathode Material on the Surface of a Transparent Substrate The cathode material is exemplified by, in addition to the anode materials mentioned above for a normal stack-type organic thin-film solar cell, fluorine-doped tin oxide (FTO).

The transparent substrate is exemplified by the anode materials mentioned above for a normal stack-type organic thin film solar cell.

The method of forming the layer of cathode material (cathode layer) too, as described above, is selected from among the above dry processes in cases where this material is difficult to dissolve, difficult to disperse and sublimable. In the case of a solution material or a dispersion material, taking into account, for example, the viscosity and surface tension of the composition and the desired thickness of the thin film, the optimal method from among the various types of wet processes mentioned above is employed.

Alternatively, a commercial transparent cathode substrate may be used in this case. From the standpoint of increasing the device yield, the use of a substrate that has been subjected to leveling treatment is preferred. When a commercial transparent cathode substrate is used, the method of manufacturing the organic thin-film solar cell of the invention does not include a cathode layer-forming step.

In cases where a transparent cathode substrate is formed using an inorganic oxide as the cathode material, cleaning treatment and surface treatment similar to that used for the anode material in a normal stack-type organic thin-film solar cell may be carried out.

[Formation of Electron-Collecting Layer]:
Step of Forming an Electron-Collecting Layer on the Formed Cathode Where necessary, an electron-collecting layer may be formed between the active layer and the cathode layer in order to, for example, make charge transport more efficient.

Illustrative examples of electron-collecting layer-forming materials include, in addition to the materials mentioned above in connection with a normal stack-type organic thin-film solar cell, zinc oxide (ZnO), titanium oxide (TiO) and tin oxide (SnO).

The method of forming the electron-collecting layer too is selected from among the above dry processes in cases where this material is difficult to dissolve, difficult to disperse and sublimable. In the case of a solution material or a dispersion material, taking into account, for example, the viscosity and surface tension of the composition and the desired thickness of the thin film, the optimal method from among the various types of wet processes mentioned above is employed. Alternatively, an inorganic oxide layer-forming method that uses a wet process (especially spin coating or slit coating) to form an inorganic oxide precursor layer on the cathode, and then fires the precursor layer may be employed

[Formation of Active Layer]:
Step of Forming an Active Layer on the Formed Electron-Collecting Layer The active layer may be a layer obtained by stacking an n layer which is a thin film consisting of an n-type semiconductor material and a p layer which is a thin film consisting of a p-type semiconductor material, or may be a non-stacked thin film consisting of a mixture of these materials.

The n-type and p-type semiconductor materials are exemplified by the same materials as mentioned above as semiconductor materials for a normal stack-type device, although $PC_{61}BM$ and $PC_{71}BM$ are preferred as the n-type material, and polymers having a thiophene skeleton on the main chain, such as PTB7, are preferred as the p-type material.

The method of forming the active layer too is similar to the method described above for the active layer in normal stack-type devices.

[Formation of Hole-Collecting Layer]:
Step of Forming a Hole-Collecting Layer on the Formed Active Layer Using the inventive composition, a hole-collecting layer is formed on the layer of active material in accordance with the above method.

[Formation of Anode Layer]:
Step of Forming an Anode Layer on the Formed Hole-Collecting Layer The anode material is exemplified in the same way as the above-described anode material for normal stack-type devices. The method of forming an anode layer is similar to that used to form the cathode layer in a normal stack-type device.

[Formation of Carrier-Blocking Layers]
As with normal stack-type devices, where necessary, carrier-blocking layers may be provided to desired layer intervals for such purposes as to control the rectifiability of the photoelectric current.

The hole-blocking layer-forming material and the electron-blocking layer-forming material are exemplified in the same way as above, and the methods of forming the carrier-blocking layers are also the same as above.

An OPV device manufactured by the exemplary method described above, to prevent its deterioration from exposure to the atmosphere, can again be placed in a glovebox and subjected to a sealing operation under a nitrogen or other inert gas atmosphere and, in the sealed state, made to function as a solar cell or measurement of the solar cell characteristics carried out.

Examples of the sealing method include a method that involves bonding a concave glass substrate having a UV-curable resin attached at the edge to the film-forming side of an organic thin-film solar cell device and curing the resin by UV irradiation, all in an inert gas atmosphere, and a method in which film-type sealing is carried out in a vacuum by a technique such as sputtering.

EXAMPLES

Working Examples and Comparative Examples are given below to more concretely illustrate the invention, although the invention is not limited by these Examples. The equipment used was as follows.

(1) $^1$H-NMR
 Apparatus: ECX-300, from JEOL Ltd.
 Solvent Used in Measurement: Dimethylsulfoxide-d6 (Junsei Chemical Co., Ltd.)
(2) Glovebox: VAC glovebox system, from Yamahachi &Co., Ltd.
(3) Vapor Deposition System: A vacuum deposition system from Aoyama Engineering KK
(4) Solar Simulator: OTENTOSUN-III, AM 1.5 G filter; radiation intensity, 100 mW/cm$^2$; from Bunkoukeiki Co., Ltd.
(5) Source Measurement Unit: 2612A, from Keithley Instruments KK
(6) GPC
 Apparatus: HLC-8320 GPC Eco SEC, from Tosoh Corporation
 Column: TSKgel G3000PWXL, from Tosoh Corporation
 Column temperature: 40° C.
 Eluant: 100 mM sodium nitrate solution (aqueous)
 Fluid delivery rate: 0.5 mL/min
 Detector: UV (254 nm)
 Calibration curve: standard sodium polystyrene sulfonate (Aldrich Co.)

(7) Film Thickness Measurement: Surfcorder ET-4000, from Kosaka Laboratory, Ltd.
(8) Measurement of Ionization Potential: AC-3, from Riken Keiki Co., Ltd.

[1] Preparation of Active Layer Composition

Preparation Example 1

Chlorobenzene (2.0 mL) was added to a sample vial containing 20 mg of PTB7 (available from 1-Material) and 30 mg of $PC_{61}BM$ (available from Frontier Carbon Corporation under the product name "nanom spectra E100"), and the vial contents were stirred for 15 hours on a hot plate set to 80° C. The resulting solution was then allowed to cool to room temperature, following which 60 μL of 1,8-diiodooctane (Tokyo Chemical Industry Co., Ltd.) was added and stirring was carried out, giving Solution A1 (an active layer composition).

[2] Synthesis of Polymethoxyaniline Sulfonic Acid

Synthesis Example 1 o-Anisidine-5-sulfonic acid (20 mmol) and 20 mmol of triethylamine were dissolved in 9 mL of a mixed solvent containing 4.5 mL of distilled water and 4.5 mL of acetonitrile at room temperature, giving Solution 1. Next, Solution 2 obtained by dissolving 20 mmol of ammonium peroxodisulfate and 1.1 g of 98% concentrated sulfuric acid in 18 mL of a mixed solvent containing 9 mL of distilled water and 9 mL of acetonitrile was cooled to 0° C., and Solution 1 was added dropwise thereto over a period of 30 minutes.

Following the completion of dropwise addition, the reaction solution was additionally stirred for 1 hour at 25° C., after which the reaction product was separated off by suction filtration. The collected solids were washed with 200 mL of methyl alcohol and then vacuum dried, giving 2.78 g of polymethoxyaniline sulfonic acid as a green powder.

The resulting polymer had a weight-average molecular weight, as measured by gel permeation chromatography (GPC), of 1,366.

[3] Production of Hole-Collecting Layer Compositions

Working Example 1-1

A brown solution having a concentration of 2.8 wt % was prepared by dissolving 1.44 g of the polymethoxyaniline sulfonic acid obtained in Synthesis Example 1 in 50 g of distilled water. The brown solution was filtered with a syringe filter having a pore size of 0.45 μm, giving Hole-Collecting Layer Composition B1.

Working Example 1-2

A brown solution was prepared by adding and completely dissolving 42.0 mg of Arylsulfonic Acid Compound A of above formula (2-1) synthesized as described in WO 2006/025342 in 3.0 g of the aqueous solution of polymethoxyaniline sulfonic acid having a concentration of 2.8 wt % prepared in Working Example 1-1. The brown solution was filtered with a syringe filter having a pore size of 0.45 μm, giving Hole-Collecting Layer Composition B2.

Working Example 1-3

A brown solution was prepared by adding and completely dissolving 64.4 mg of Arylsulfonic Acid Compound A in 2.3 g of the aqueous solution of polymethoxyaniline sulfonic acid having a concentration of 2.8 wt % prepared in Working Example 1-1. The brown solution was filtered with a syringe filter having a pore size of 0.45 μm, giving Hole-Collecting Layer Composition B3.

Working Example 1-4

A brown solution was prepared by adding and completely dissolving 84.0 mg of Arylsulfonic Acid Compound A (84.0 mg) in 1.5 g of the aqueous solution of polymethoxyaniline sulfonic acid having a concentration of 2.8 wt % prepared in Working Example 1-1. The brown solution was filtered with a syringe filter having a pore size of 0.45 μm, giving Hole-Collecting Layer Composition B4.

Comparative Example 1-1

PEDOT/PSS (Clevios Al 4083, from Heraeus) was filtered with a syringe filter having a pore size of 0.45 μm, giving Hole-Collecting Layer Composition C1.

Comparative Example 1-2

PEDOT/PSS (Clevios CH 8000, from Heraeus) was filtered with a syringe filter having a pore size of 0.45 μM, giving Hole-Collecting Layer Composition C2.

[4] Organic Thin-Film Solar Cell Production

Working Example 2-1

A 20 mm×20 mm glass substrate patterned thereon with, as the anode, an ITO transparent conductive layer in the form of 2 mm×20 mm stripes was subjected to 15 minutes of UV/ozone treatment, following which Hole-Collecting Layer Composition B1 prepared in Working Example 1-1 was spin-coated onto the substrate. This glass substrate was heated on a hot plate at 120° C. for 10 minutes, thereby forming a hole-collecting layer. The hole-collecting layer had a film thickness of about 30 nm.

Within a glovebox purged with an inert gas, film formation was subsequently carried out by the dropwise addition of Solution A1 obtained in Preparation Example 1 onto the resulting hole-collecting layer and spin coating, thereby forming an active layer.

Next, the substrate on which an organic semiconductor layer had been formed and a negative electrode mask were placed within a vacuum vapor deposition system, the interior of the system was evacuated to a vacuum of $1 \times 10^{-3}$ Pa or below, and a lithium 8-hydroxyquinolinolate layer as the electron-collecting layer was vapor deposited to a thickness of 1 nm by a resistance heating method.

First, vapor deposition of an aluminum layer to a thickness of 80 nm as the negative electrode was carried out by a resistance heating method, thereby producing an OPV device in which the regions where the striped ITO layer and the aluminum layer intersect have surface areas of 2 mm×2 mm.

Working Example 2-2

Aside from using Hole-Collecting Layer Composition B2 instead of Hole-Collecting Layer Composition B1, an OPV device was produced in the same way as in Working Example 2-1.

Working Example 2-3

Aside from using Hole-Collecting Layer Composition B3 instead of Hole-Collecting Layer Composition B1, an OPV device was produced in the same way as in Working Example 2-1.

Working Example 2-4

Aside from using Hole-Collecting Layer Composition B4 instead of Hole-Collecting Layer Composition B1, an OPV device was produced in the same way as in Working Example 2-1.

Comparative Example 2-1

Aside from using Hole-Collecting Layer Composition C1 instead of Hole-Collecting Layer Composition B1, an OPV device was produced in the same way as in Working Example 2-1.

Comparative Example 2-2

Aside from using Hole-Collecting Layer Composition C2 instead of Hole-Collecting Layer Composition B1, an OPV device was produced in the same way as in Working Example 2-1.

[5] Evaluation of Properties

The short-circuit current density Jsc (mA/cm$^2$), the open-circuit voltage Voc (V), the fill factor FF and the photoelectric conversion efficiency PCE (%) of the respective OPV devices produced in Working Examples 2-1 to 2-4 and Comparative Examples 2-1 and 2-2 were evaluated. The results are shown in Table 1.

The PCE (%) was computed as follows.

PCE (%)=Jsc (mA/cm$^2$)×Voc ($V$)×FF÷incident light intensity (100 (mW/cm$^2$))×100

The ionization potentials (Ip) of the respective hole-collecting layers measured with the AC-3 are also shown in Table 1. The active layer formed by using the same method as in Working Example 2-1 to deposit solution A1, which is the active layer composition obtained in Preparation Example 1, on ITO had an ionization potential of 5.2 eV. The ionization potential of this active layer was substantially the same as the ionization potential of a film of the p-type material PTB7 alone.

TABLE 1

| | $J_{sc}$ (mA/cm$^2$) | $V_{oc}$ (V) | FF | PCE (%) | Ip (eV) |
|---|---|---|---|---|---|
| Working Example 2-1 | 14.7 | 0.73 | 0.60 | 6.4 | 5.1 |
| Working Example 2-2 | 15.4 | 0.76 | 0.62 | 7.2 | 5.1 |
| Working Example 2-3 | 14.7 | 0.77 | 0.63 | 7.2 | 5.2 |
| Working Example 2-4 | 14.2 | 0.77 | 0.67 | 7.4 | 5.2 |
| Comparative Example 2-1 | 11.3 | 0.78 | 0.67 | 5.9 | 5.3 |
| Comparative Example 2-2 | 7.1 | 0.79 | 0.17 | 0.9 | 5.7 |

As shown in Table 1, OPV devices provided with, as the hole-collecting layer, a thin film obtained from the hole-collecting layer composition of the invention, when compared with OPV devices provided with, as the hole-collecting layer, a thin film obtained from the commonly used PEDOT/PSS, exhibited high photoelectric conversion efficiencies. In addition, the ionization potential increased with the addition of the electron-accepting dopant Arylsulfonic Acid Compound A and, in cases where the ionization potential was substantially the same as that of the p-type material PTB7, the photoelectric conversion efficiency of the OPV device obtained using this exhibited an even higher value.

It is thus apparent that OPV devices having excellent photoelectric conversion characteristics can be produced using the hole-collecting layer composition of the invention.

[6] Production of Water-Resistant Hole-Collecting Layer Compositions

Working Example 3-1

The polymethoxyaniline sulfonic acid obtained in Synthesis Example 1 (41.7 mg) was dissolved in 2.0 g of distilled water and 2.0 g of ethanol, and 124.8 mg of tetraethoxysilane was added, thereby preparing a brown solution having a concentration of 4.0 wt %. The resulting brown solution was filtered using a syringe filter having a pore size of 0.45 μm, giving Hole-Collecting Layer Composition D1.

Working Example 3-2

The polymethoxyaniline sulfonic acid obtained in Synthesis Example 1 (42.7 mg) was dissolved in 2.0 g of distilled water and 2.0 g of ethanol, and 213.1 mg of tetraethoxysilane was added, thereby preparing a brown solution having a concentration of 6.0 wt %. The resulting brown solution was filtered using a syringe filter having a pore size of 0.45 μm, giving Hole-Collecting Layer Composition D2.

Working Example 3-3

The polymethoxyaniline sulfonic acid obtained in Synthesis Example 1 (27.7 mg) and 14.0 mg of Arylsulfonic Acid Compound A of above formula (2-1) synthesized as described in WO 2006/025342 were dissolved in 2.0 g of distilled water and 2.0 g of ethanol, and 82.9 mg of tetraethoxysilane was added, thereby preparing a brown solution having a concentration of 3.0 wt %. The resulting brown solution was filtered using a syringe filter having a pore size of 0.45 μm, giving Hole-Collecting Layer Composition D3.

Working Example 3-4

The polymethoxyaniline sulfonic acid obtained in Synthesis Example 1 (19.2 mg) and 9.8 mg of Arylsulfonic Acid Compound A were dissolved in 2.0 g of distilled water and 2.0 g of ethanol, and 95.7 mg of tetraethoxysilane was added, thereby preparing a brown solution having a concentration of 3.0 wt %. The resulting brown solution was filtered using a syringe filter having a pore size of 0.45 μm, giving Hole-Collecting Layer Composition D4.

Reference Example 3-1

The polymethoxyaniline sulfonic acid obtained in Synthesis Example 1 (20.3 mg) was dissolved in 1.0 g of distilled water and 1.0 g of ethanol, thereby preparing a brown solution having a concentration of 1.0 wt %. The resulting brown solution was filtered using a syringe filter having a pore size of 0.45 μm, giving Hole-Collecting Layer Composition E1.

Reference Example 3-2

The polymethoxyaniline sulfonic acid obtained in Synthesis Example 1 (54.7 mg) and 27.5 mg of Arylsulfonic Acid Compound A were dissolved in 2.0 g of distilled water and 2.0 g of ethanol, thereby preparing a brown solution having a concentration of 2.0 wt %. The resulting brown solution was filtered using a syringe filter having a pore size of 0.45 μm, giving Hole-Collecting Layer Composition E2.

Comparative Example 3-1

PEDOT/PSS (Clevios Al 4083, from Heraeus) was filtered with a syringe filter having a pore size of 0.45 μm, giving Hole-Collecting Layer Composition E3.
[7] Production of Hole-Collecting Layer, and Evaluation of Water Resistance Working Example 4-1

A hole-collecting layer was formed using Hole-Collecting Layer Composition D1 and an OPV device was produced by the same method as in Working Example 2-1, following which the properties were evaluated. In a separate procedure, a hole-collecting layer was formed in the same way, after which, in order to carry out a water-resistance test on the hole-collecting layer, three drops of water were added onto the hole-collecting layer and spin coating was carried out, followed by 5 minutes of drying at 120° C. The film thickness and ionization potential of the hole-collecting layer before and after the water-resistance test were measured, and the residual film ratio was computed to determine the change in film thickness. In addition, with regard to the hole-collecting layer following the water resistance test, an OPV device was produced and the characteristics were evaluated in the same way as in Working Example 2-1. The results are shown in Table 2.

Working Example 4-2

Aside from using Hole-Collecting Layer Composition D2 instead of Hole-Collecting Layer Composition D1, hole-collecting layer production and water-resistance testing, and also OPV device production and evaluation of the characteristics, were carried out in the same way as in Working Example 4-1. The results are shown in Table 2.

Working Example 4-3

Aside from using Hole-Collecting Layer Composition D3 instead of Hole-Collecting Layer Composition D1, hole-collecting layer production and water-resistance testing, and also OPV device production and evaluation of the characteristics, were carried out in the same way as in Working Example 4-1. The results are shown in Table 2.

Working Example 4-4

Aside from using Hole-Collecting Layer Composition D4 instead of Hole-Collecting Layer Composition D1, hole-collecting layer production and water-resistance testing, and also OPV device production and evaluation of the characteristics, were carried out in the same way as in Working Example 4-1. The results are shown in Table 2.

Reference Example 4-1

Aside from using Hole-Collecting Layer Composition E1 instead of Hole-Collecting Layer Composition D1, hole-collecting layer production and water-resistance testing were carried out in the same way as in Working Example 4-1. The results are shown in Table 2.

Reference Example 4-2

Aside from using Hole-Collecting Layer Composition E2 instead of Hole-Collecting Layer Composition D1, hole-collecting layer production and water-resistance testing were carried out in the same way as in Working Example 4-1. The results are shown in Table 2.

Comparative Example 4-3

Aside from using Hole-Collecting Layer Composition E3 instead of Hole-Collecting Layer Composition D1, hole-collecting layer production and water-resistance testing were carried out in the same way as in Working Example 4-1. The results are shown in Table 2.

TABLE 2

| | Ip (eV) | PCE (%) | Film thickness before water resistance test (nm) | Film thickness after water resistance test (nm) | Residual film ratio (%) | PCE after water resistance test (%) |
|---|---|---|---|---|---|---|
| Working Example 4-1 | 5.4 | 5.4 | 24.0 | 22.9 | 95 | 5.6 |
| Working Example 4-2 | 5.4 | 6.0 | 41.9 | 39.7 | 95 | 5.7 |
| Working Example 4-3 | 5.4 | 7.0 | 25.1 | 17.2 | 69 | 6.4 |
| Working Example 4-4 | 5.5 | 3.9 | 23.0 | 22.8 | 99 | 4.2 |
| Reference Example 4-1 | — | — | 15.9 | 0 | 0 | — |
| Reference Example 4-2 | — | — | 29.3 | 0 | 0 | — |
| Comparative Example 4-3 | — | — | 16.1 | 0 | 0 | — |

On comparing the results in Table 2 and Table 1, it is apparent that thin films produced from tetraethoxysilane-containing compositions, compared with thin films produced from compositions not containing tetraethoxysilane, have a deeper ionization potential and adjustment of the HOMO level is possible.

It is also apparent that thin films produced from tetraethoxysilane-containing compositions, compared with thin films produced from compositions containing no tetraethoxysilane and thin films obtained from the commonly used PEDOT/PSS, exhibit a high water resistance and, moreover, maintain a high photoelectric conversion efficiency even after the water resistance test.

[8] Production of Hole-Collecting Layer Compositions (2)

Working Example 5-1

A brown solution was prepared by dissolving 50 mg of the polymethoxyaniline sulfonic acid obtained in Synthesis Example 1 and 500 mg of a 20% aqueous solution of polystyrenesulfonic acid (FUNCHEM-PSSH (20), from Tomiyama Pure Chemical Industries, Ltd.; molecular weight, 14,000) in 4.45 g of water. The brown solution was filtered with a syringe filter having a pore size of 0.45 μm, giving Hole-Collecting Layer Composition F1.

Working Example 5-2

A brown solution was prepared by dissolving 75 mg of the polymethoxyaniline sulfonic acid obtained in Synthesis Example 1 and 375 mg of a 20% aqueous solution of 1,3,6-naphthalenetrisulfonic acid (FUNCHEM-NTSH (20), from Tomiyama Pure Chemical Industries, Ltd.) in 4.55 g of water. The brown solution was filtered with a syringe filter having a pore size of 0.45 μm, giving Hole-Collecting Layer Composition F2.

[9] Production of Organic Thin-Film Solar Cell (2)

Working Example 6-1

A hole-collecting layer was formed using Hole-Collecting Layer Composition F1 and an OPV device was produced in the same way as in Working Example 2-1.

Working Example 6-2

Aside from using Hole-Collecting Layer Composition F2 instead of Hole-Collecting Layer Composition F1, an OPV device was produced in the same way as in Working Example 6-1.

Evaluations of the initial characteristics were carried out on the respective OPV devices produced in Working Examples 6-1 and 6-2 and in Comparative Example 2-1. Conversion efficiency measurements were then carried out after irradiating the OPV devices for 6 hours with simulated sunlight at an illuminance of 100 mW/cm² with a solar cell durability testing system (SML-2K1AV4, from Seric Co., Ltd.) using a 2,000 W metal halide lamp. The percent retention of the conversion efficiency was computed using the following formula. The initial characteristics and percent retention of conversion efficiency are shown in Table 3.

Retention of conversion efficiency (%)=(conversion efficiency after durability test÷initial conversion efficiency)×100

TABLE 3

| | $J_{sc}$ (mA/cm²) | $V_{oc}$ (V) | FF | PCE (%) | Ip (eV) | Retention of conversion efficiency after carrying out light resistance test (%) |
|---|---|---|---|---|---|---|
| Working Example 6-1 | 12.5 | 0.73 | 0.56 | 5.1 | 5.3 | 69 |
| Working Example 6-2 | 12.1 | 0.76 | 0.69 | 6.4 | 5.0 | 70 |
| Comparative Example 2-1 | 11.3 | 0.78 | 0.67 | 5.9 | 5.3 | 53 |

As shown in Table 3, OPV devices which use polystyrenesulfonic acid or 1,3,6-naphthalenetrisulfonic acid as the dopant with respect to a polymethoxyaniline sulfonic acid host had a better durability than devices which used PEDOT: PSS.

The invention claimed is:

1. A composition for a hole-collecting layer in an organic photoelectric conversion device, the composition comprising a charge-transporting substance consisting of a polyaniline derivative of formula (1):

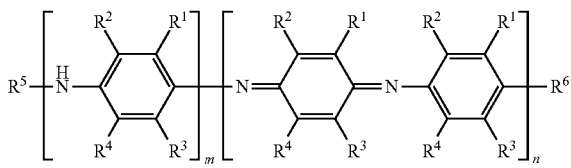

wherein $R^1$ to $R^4$ are each independently a hydrogen atom, a halogen atom, a nitro group, a cyano group, a sulfonic acid group, an alkoxy group of 1 to 20 carbon atoms, a thioalkoxy group of 1 to 20 carbon atoms, an alkyl group of 1 to 20 carbon atoms, an alkenyl group of 2 to 20 carbon atoms, an alkynyl group of 2 to 20 carbon atoms, a haloalkyl group of 1 to 20 carbon atoms, an aryl group of 6 to 20 carbon atoms, an aralkyl group of 7 to 20 carbon atoms or an acyl group of 1 to 20 carbon atoms, with one of the $R^1$ to $R^4$ moieties being a sulfonic acid group and a single one of the remaining $R^1$ to $R^4$ moieties being an alkoxy group of 1 to 10 carbon atoms, $R^5$ and $R^6$ are a hydrogen atom, and m and n are each numbers which satisfy the conditions $0 \leq m \leq 1$, $0 \leq n \leq 1$ and $m+n = 1$, and a solvent.

2. The composition for a hole-collecting layer in an organic photoelectric conversion device according to claim 1, wherein $R^1$ is a sulfonic acid group and $R^4$ is an alkoxy group of 1 to 20 carbon atoms.

3. The composition for a hole-collecting layer in an organic photoelectric conversion device according to claim 1 or 2, further comprising an electron-accepting dopant substance that differs from the polyaniline derivative of formula (1).

4. The composition for a hole-collecting layer in an organic photoelectric conversion device according to claim 3, wherein the electron-accepting dopant substance is a Brønsted acid.

5. The composition for a hole-collecting layer in an organic photoelectric conversion device according to claim 3, wherein the electron-accepting dopant substance is an arylsulfonic acid compound of formula (2):

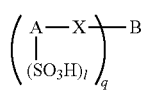

wherein X represents oxygen; A is a naphthalene ring or an anthracene ring; B is a divalent to tetravalent perfluorobiphenyl group; the letter l is an integer that represents the number of sulfonic acid groups bonded to A and satisfies the condition $1 \leq l \leq 4$; and q is an integer that represents the number of bonds between B and X and is from 2 to 4, naphthalenetrisulfonic acid or polystyrenesulfonic acid.

6. The composition for a hole-collecting layer in an organic photoelectric conversion device according to claim 1, further comprising an alkoxysilane.

7. The composition for a hole-collecting layer in an organic photoelectric conversion device according to claim 1, wherein the organic photoelectric conversion device is an organic thin-film solar cell or a photosensor.

8. The composition for a hole-collecting layer in an organic photoelectric conversion device according to claim 1, wherein the solvent includes a high-viscosity solvent having a viscosity at 25° C. of from 10 to 500 mPa·s.

9. The composition for a hole-collecting layer in an organic photoelectric conversion device according to claim 1, wherein the solvent consists of one or more solvent selected from alcohol solvents and water.

10. A hole-collecting layer obtained using the composition for a hole-collecting layer in an organic photoelectric conversion device according to claim 1.

11. An organic photoelectric conversion device comprising the hole-collecting layer of claim 10 and an active layer provided so as to be in contact therewith.

12. The organic photoelectric conversion device of claim 11, wherein the ionizing potential of the hole-collecting layer and the ionizing potential of a p-type semiconductor included in the active layer have a difference therebetween of not more than 0.2 eV.

13. The organic photoelectric conversion device of claim 11 or 12, wherein the active layer includes a fullerene derivative.

14. The organic photoelectric conversion device of claim 11 or 12, wherein the active layer includes a polymer having a thiophene skeleton on the main chain.

15. The organic photoelectric conversion device of claim 11 or 12, wherein the active layer includes a fullerene derivative and a polymer having a thiophene skeleton on the main chain.

16. The organic photoelectric conversion device of claim 11 which is an inverted stack structure-type device.

17. The organic photoelectric conversion device of claim 11 which is an organic thin-film solar cell or a photosensor.

18. A charge-transporting composition comprising a charge-transporting substance consisting of a polyaniline derivative of formula (1):

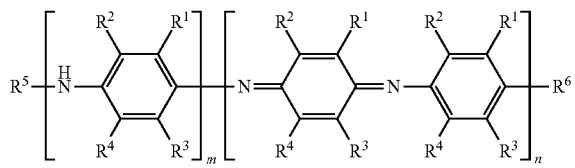

wherein $R^1$ to $R^4$ are each independently a hydrogen atom, a halogen atom, a nitro group, a cyano group, a sulfonic acid group, an alkoxy group of 1 to 20 carbon atoms, a thioalkoxy group of 1 to 20 carbon atoms, an alkyl group of 1 to 20 carbon atoms, an alkenyl group of 2 to 20 carbon atoms, an alkynyl group of 2 to 20 carbon atoms, a haloalkyl group of 1 to 20 carbon atoms, an aryl group of 6 to 20 carbon atoms, an aralkyl group of 7 to 20 carbon atoms or an acyl group of 1 to 20 carbon atoms, with one of the $R^1$ to $R^4$ moieties being a sulfonic acid group and a single one of the remaining $R^1$ to $R^4$ moieties being an alkoxy group of 1 to 10 carbon atoms, $R^5$ and $R^6$ are a hydrogen atom, and m and n are each numbers which satisfy the conditions $0 \leq m \leq 1$, $0 \leq n \leq 1$ and $m+n=1$, an electron-accepting dopant substance differing from the polyaniline derivative of formula (1), and a solvent.

19. The charge-transporting composition of claim 18 which further comprises an alkoxysilane.

20. The charge-transporting composition of claim 18 or 19, wherein the electron-accepting dopant substance is an arylsulfonic acid compound of formula (2):

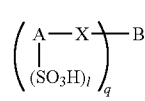

wherein X represents oxygen, A is a naphthalene ring or an anthracene ring, B is a divalent to tetravalent perfluorobiphenyl group, the letter l is an integer that represents the number of sulfonic acid groups bonded to A and satisfies the condition $1 \leq l \leq 4$, and q is an integer that represents the number of bonds between B and X and is from 2 to 4, naphthalenetrisulfonic acid or polystyrenesulfonic acid.

* * * * *